United States Patent
Kotamraju

(10) Patent No.: US 10,432,155 B2
(45) Date of Patent: Oct. 1, 2019

(54) FAST STARTUP BIAS CURRENT GENERATOR

(71) Applicant: DIALOG SEMICONDUCTOR (UK) LIMITED, London (GB)

(72) Inventor: Pranav Kotamraju, Santa Clara, CA (US)

(73) Assignee: DIALOG SEMICONDUCTOR (UK) LIMITED, London (GB)

( * ) Notice: Subject to any disclaimer, the term of this patent is extended or adjusted under 35 U.S.C. 154(b) by 0 days.

(21) Appl. No.: 15/891,221

(22) Filed: Feb. 7, 2018

(65) Prior Publication Data

US 2019/0245499 A1    Aug. 8, 2019

(51) Int. Cl.
- H03F 3/45 (2006.01)
- H03F 1/02 (2006.01)
- G05F 1/56 (2006.01)

(52) U.S. Cl.
CPC ....... *H03F 3/45179* (2013.01); *H03F 1/0205* (2013.01); *H03F 2200/267* (2013.01); *H03F 2203/45112* (2013.01)

(58) Field of Classification Search
USPC ................................. 330/252–261, 285, 296
See application file for complete search history.

(56) References Cited

U.S. PATENT DOCUMENTS

| | | | |
|---|---|---|---|
| 5,142,219 A * | 8/1992 | Hsu .................. | G05F 1/575 323/314 |
| 2018/0348805 A1 * | 12/2018 | Elsayed ............. | G05F 1/561 |

* cited by examiner

*Primary Examiner* — Hieu P Nguyen
(74) *Attorney, Agent, or Firm* — Haynes and Boone, LLP

(57) ABSTRACT

A bias current generator is disclosed that include an operational amplifier that is self-biased during an inactive period with a bias current to bias a gate of an output transistor. Since the inactive period bias is close to an active period bias applied to the gate of the output transistor during active operation of the bias current generator, the speed of transition from the inactive period to the active period is enhanced by the self-biasing of the operational amplifier.

17 Claims, 3 Drawing Sheets

FAST STARTUP BIAS CURRENT GENERATOR

TECHNICAL FIELD

This application relates to bias current generators, and more particularly to bias current generators configured for fast startup.

BACKGROUND

Mobile devices such as tablets and smartphones typically use lithium batteries that produce relatively high voltages such as 4 V. Although such batteries are efficient and have relatively long lifespans, their resulting voltages are too high for modern transistor processing nodes. For example, it is conventional for digital cores to operate with power supply voltages of less than 1 V. Mobile devices thus typically include a buck converter for regulating the relatively-high battery voltage into a relatively-low power supply voltage for its digital circuits.

Buck converters (and other types of switching power converters) will typically include a bias current generator to generate a bias current (for example, 10 μA) that is used by various other converter components. An example conventional bias current generator 100 is shown in FIG. 1. An operational amplifier 105 drives a gate of an NMOS output transistor M1 with a control voltage responsive to the difference between a source voltage for transistor M1 and a reference voltage such as a bandgap reference voltage (VBG). The source of transistor M1 couples to ground through a resistance R1. Feedback through operational amp 105 will thus keep the source voltage for transistor M1 equal to the reference voltage VGB such that a bias current I conducted through resistor R1 equals VBG/R1 by Ohm's law. This bias current I is then mirrored through current mirrors formed by a diode-connected PMOS transistor P1 having its gate (and drain) voltage also driving the gates of PMOS transistors P2 and P3 that have their sources coupled to a power supply voltage VDD in common with the source of diode-connected transistor P1. Transistors P2 and P3 will thus mirror the bias current I into a secondary current that is proportional to the bias current with the proportionality depending upon the size ratios between transistors P1, P2, and P3.

Note that it is common for a mobile device processor to enter a sleep mode during periods of inactivity to conserve battery power. It is desirable for the mobile device processor to be able to wake up and enter normal operation from such a sleep mode as quickly as possible. To enable such a fast transition, bias current generator 100 may be left running during the sleep mode (which may also be denoted as a dormant mode or an inactive period) but such constant operation lowers efficiency due to the resulting drain of the bias and secondary currents. But switching off bias current generator 100 is also problematic since feedback through operational amplifier 105 takes some time to settle such that stable bias current generation typically requires several micro-seconds, which lowers the transition speed from sleep mode to normal operation.

Accordingly, there is a need in the art for improved bias current generators that may be powered off during inactive periods but which can quickly settle after being powered on during active periods to provide a stable bias current with minimal delay.

SUMMARY

A bias current generator is disclosed that includes a current source biasing nodes of an operational amplifier while the bias current generator is quiescent and not producing a bias current. In an active mode in which the bias current generator is generating the bias current, the current source does not bias the operational amplifier nodes. The self-biasing of the nodes by the current source while the bias current generator is not generating the bias current is quite advantageous because the transition from dormant to active operation is very rapid, for example on the order of nano-seconds. In contrast, conventional transitions to active mode operation for bias current generators take substantially longer. Moreover, this improved transition speed comes at the cost of very little power consumption during inactive operation since the current source biases the operational amplifier nodes with a node-biasing current that is small in comparison to the bias current.

These advantageous features may be better appreciated through a consideration of the detailed description below.

BRIEF DESCRIPTION OF THE DRAWINGS

Embodiments of the present disclosure and their advantages are best understood by referring to the detailed description that follows. It should be appreciated that like reference numerals are used to identify like elements illustrated in one or more of the figures.

DETAILED DESCRIPTION

A bias current generator is provided that is associated with a current source that biases nodes of an operational amplifier in the bias current generator with a node-biasing current conducted through a switching network. The switching network functions so that the operational amplifier nodes are biased by the node-biasing current only while the bias current generator is turned off during a dormant mode of operation in which the bias current generator does not generate its bias current. When the bias current generator transitions to the active mode of operation so as to generate the bias current, the switching network prevents the current source from biasing the nodes of the operational amplifier with the node-biasing current. The resulting transition from dormant to active production of the bias current is advantageously fast due to the biasing of the operational amplifier nodes. Yet power consumption is reduced because the node-biasing current is small compared to the bias current. For example, the bias current may be 5 to 10 micro-amps whereas the node-biasing current may be as little as 5 to 10 nano-amps in some embodiments such that the biasing of the nodes for the operational amplifier consumes relatively little power.

Figure 1:
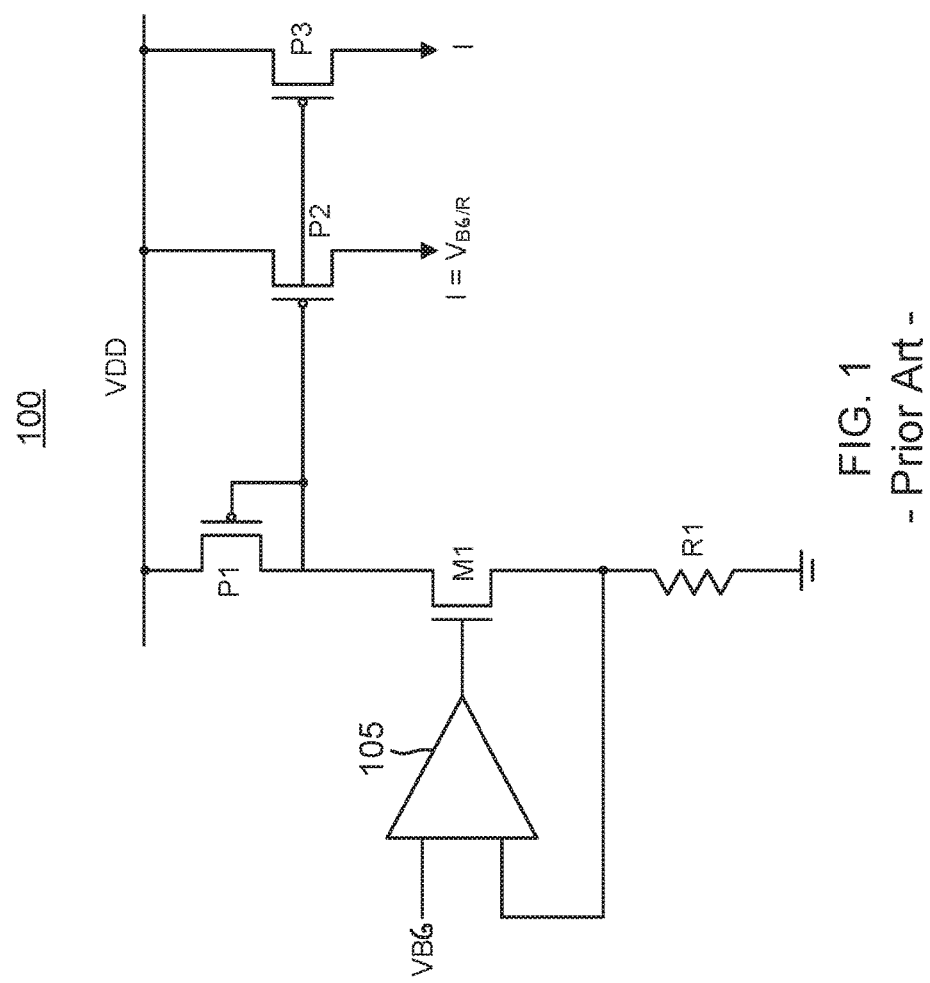
FIG. 1 is a circuit diagram of a conventional bias current generator.
Figure 2:
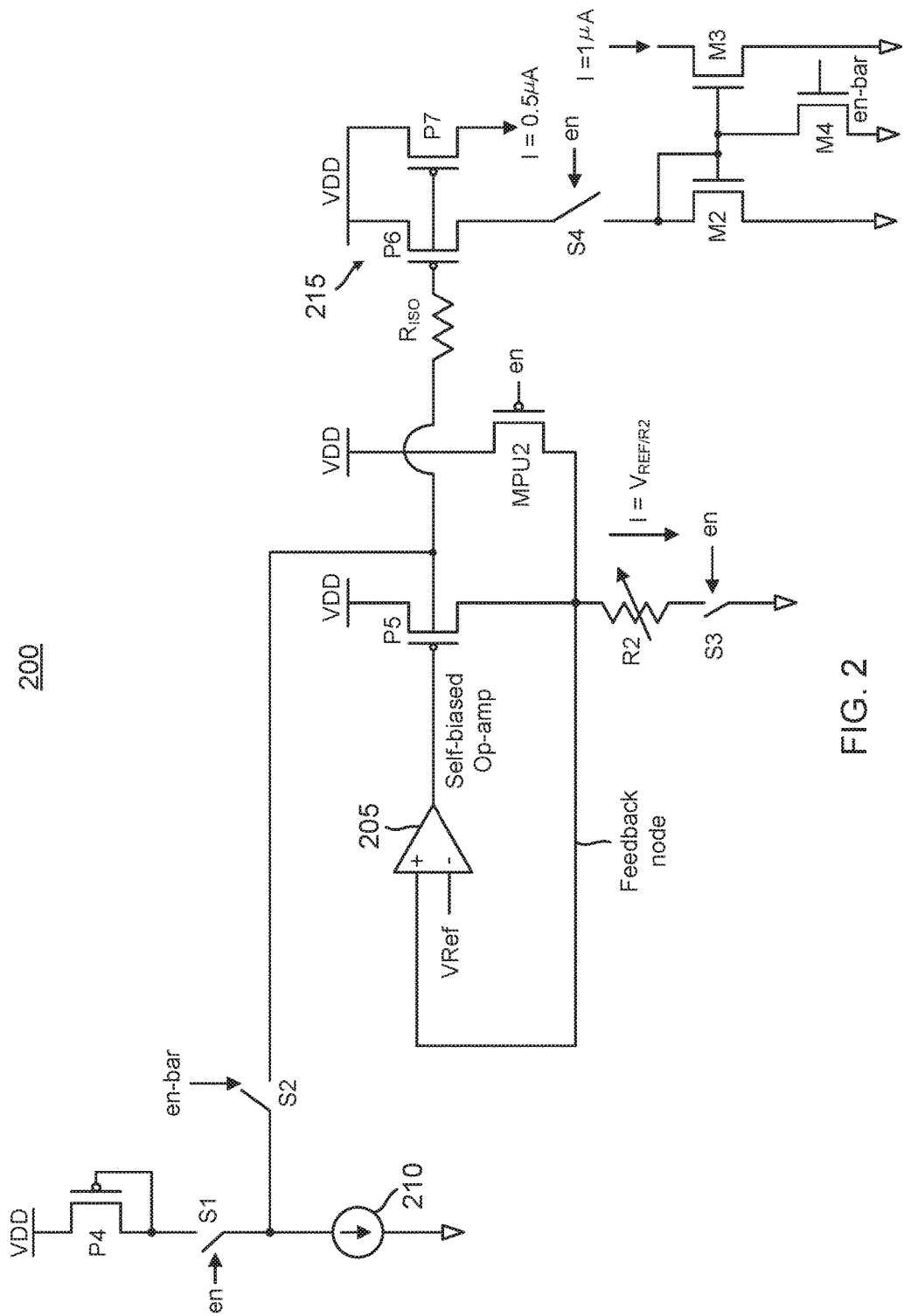
FIG. 2 is a diagram of a bias current generator in accordance with an aspect of the disclosure.

An example bias current generator 200 is shown in FIG. 2. During active operation, an operational amplifier 205 drives a gate of a PMOS output transistor P5 to control a bias current I that flows through a variable resistor R2 to ground through a switch S3 that is configured to close in response to an assertion of an enable signal. The enable signal is asserted during active operation of bias current generator 200. With switch S3 closed, feedback through operational amplifier 205 functions analogously as discussed with regard to FIG. 1 to keep the drain (designated as a feedback node) of output transistor P5 equal to a reference voltage Vref such as a bandgap voltage. The bias current I will thus equal Vref/R2 during active (normal) operation. Resistor R2 is a variable resistor so that its resistance R2 may be varied to calibrate the bias current so as to account for process, voltage, or temperature variations.

The feedback node couples through a PMOS switch transistor MPU2 to a power supply node supplying a power supply voltage VDD. The enable signal drives the gate of switch transistor MPU2 such that the feedback node is charged to the power supply voltage during inactive operation when the enable signal is de-asserted. During such inactive operation, switch S3 opens in response to the de-assertion of the enable signal to prevent output transistor P5 from conducting current. The de-assertion of the enable signal is equivalent to an assertion of a complement enable signal (en-bar) that closes a switch S2 to connect a current source 210 to the output of operational amplifier 205. Switch S2 and switch transistor MPU2 comprise the switching network that functions to bias the operational amplifier nodes. During active operation while output transistor P5 conducts the bias current, switch S2 is opened. To keep current source 210 active so that it may immediately bias operational amplifier when needed, a switch 51 closes in response to the assertion of the enable signal so that current source 210 is powered by a diode-connected PMOS transistor P4 having its source tied to the power supply node. Transistor P4 will thus source the node-biasing current to current source 210 during the active mode of operation for bias current generator 200. Switch 51 opens in response to the de-assertion of the enable signal.

Bias current generator 200 includes a secondary current generator 215 that mirrors the bias current into one or more secondary currents that may be used to bias external circuit operation such as biasing components of a switching power converter. In secondary current generator 215, the output of operational amplifier 205 drives a gate of a PMOS transistor P6 and also a gate of a PMOS transistor P7 through an isolating resistor $R_{ISO}$. Transistors P5, P6, and P7 all have their sources tied to the power supply node and have a common gate voltage. Transistor P6 will thus conduct a secondary current that is proportional to the bias current depending upon the size ratio between transistors P5 and P6. Similarly, transistor P7 will source a secondary current that that is proportional to the bias current depending upon the size ratio of transistor P7 to transistor P5. For example, if the bias current is 5 µA the current sourced by transistor P7 may be 0.5 µA. It will be appreciated that the current magnitudes discussed herein are merely exemplary. To provide a sinking in addition to such a sourcing of a secondary current, the drain of transistor P6 connects through a switch S4 to drain of a diode-connected NMOS transistor M2 in a current mirror configuration with an NMOS transistor M3. The gate of transistor M2 is thus tied to the gate of transistor M3. Both the sources of transistors M2 and M3 are tied to ground. The drain of transistor M3 will thus sink a secondary current proportional to the bias current during the active mode when switch S4 is closed in response to the assertion of the enable signal. For example, transistors M2 and M3 may be sized so that the secondary current conducted by transistor M3 is 1 µA in an embodiment in which the bias current is 5 µA. To keep transistor M3 from discharging current during the inactive mode of operation for bias current generator 200, the gate of transistor M3 is coupled to ground through an NMOS switch transistor M4 that is switched on in response to the assertion of the complement enable signal (en-bar). Switch transistor M4 thus switches off during the active mode of operation.

The biasing of the operational amplifier nodes by the node-biasing current enables operational amplifier 205 to quickly transition to stable operation in the active mode. For example, the output node of operational amplifier 205 is biased by the node-basing current. Since this output node voltage is also the gate voltage for output transistor P5, the biasing of this gate voltage is very close to the gate voltage necessary for active operation. The transition from dormant to active operation thus requires little time to transition the gate voltage of output transistor P5 to the desired level for active operation. In addition, the bias current may be relatively large as compared to the secondary currents generated by secondary current generator 215. For example, the bias current may equal 5 µA whereas the secondary current sourced by transistor P7 is an order of magnitude smaller (0.5 µA). This relatively robust level for the bias current assists operational amplifier 205 in quickly reaching stable operation with regard to driving the gate of output transistor P5 so that the bias current is stably generated at the desired level with a relatively small transition time from the dormant mode to the active mode of operation.

Figure 3:
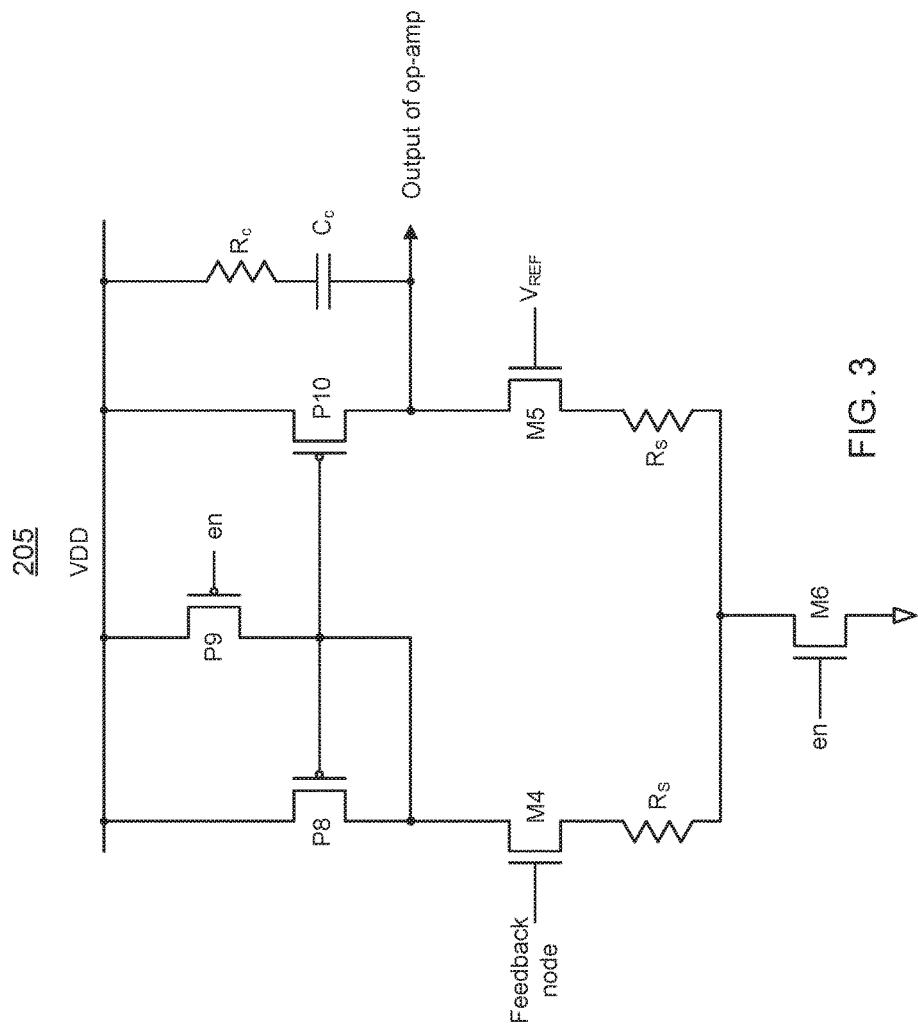
FIG. 3 is a circuit diagram of the operational amplifier in the bias current generator of FIG. 2 in accordance with an aspect of the disclosure.

The self-biasing of the operational amplifier nodes by the node-biasing current may be better understood with reference to the circuit diagram for operational amplifier 205 shown in FIG. 3. Operational amplifier 205 includes a differential pair of transistors formed by an NMOS first differential pair transistor M4 and an NMOS second differential pair transistor M5. The sources of transistors M4 and M5 couple through respective resistors Rs to a drain of an NMOS switch transistor M6 having its source connected to ground. The assertion of the enable signal switches on switch transistor M6 during active operation so that feedback through operational amplifier 205 may control the bias current as discussed above.

The feedback node voltage drives the gate of transistor M4 whereas the reference voltage drives the gate of transistor M5. During inactive operation, switch transistor MPU2 (FIG. 2) is switched on so that the feedback node is charged to the power supply voltage VDD. At the same time, current source 210 of FIG. 1 is sourcing the node-biasing current from the output of operational amplifier 205 (the drain of transistor M5). The drain of transistor M4 couples to the power supply node through a PMOS transistor P9 that is switched on while the enable signal is de-asserted. The node-biasing current may thus be sourced from the power supply node at the source of transistor P9 and flow through the channels for transistors P9 and M4 during the inactive period or mode of operation. The self-biasing current then continues to flow through both resistors Rs to the source of transistor M5, whereupon it conducts through the body diode for transistor M5 to the output of operational amplifier 205. The output node of operational amplifier 205 is tied to the gate of output transistor P5 so that the gate voltage of output transistor P5 is biased during the dormant mode of operation so as to be close to its final value that is reached during active mode of operation such that transition to the active mode of operation is rapid.

Once the enable signal is asserted, transistor M6 conducts so that transistors M4 and M5 may conduct into ground through resistors Rs and transistor M6. Transistor P9 switches off but the drain of transistor M4 also couples to the power supply node through a PMOS diode-connected transistor P8 that is in a current mirror configuration with a PMOS transistor P10. The sources of transistors P8 and P10 are tied to the power supply node. Similarly, the gate (as well as the drain) for transistor P8 is tied to the gate of transistor P10, which has its drain connected to the drain of second differential pair transistor M5. Feedback through differential pair transistors M4 and M5 will thus force the feedback node voltage to equal the reference voltage during normal (active mode) operation. In addition, this feedback may be further stabilized by a compensation circuit such as formed through a serial combination of a compensation capacitor Cc and a compensation resistor Rc that couple from the power supply node to the output node for operational amplifier 205.

A method of operation for bias current generator 200 will now be discussed. The method includes acts that occur during an inactive period for operational amplifier 205. These inactive period acts include opening the switch S3 to prevent the output transistor P5 from conducting and also closing the switch formed by switch transistor MPU2 to charge the gate of the first differential pair transistor M4 to the power supply voltage VDD while conducting the node-biasing current through a channel of the first differential pair transistor M4 and through a body diode of the second differential pair transistor M5 to bias the gate of the output transistor with the node-biasing current.

The method also includes acts that occur during the active period for operational amplifier 205. These active period acts include closing switch S3 to allow the output transistor P5 to begin conducting through the output resistor and also switching off switch transistor MPU2 so that feedback through operational amplifier 205 causes the output transistor P5 to conduct the bias current equaling a ratio of the reference voltage and the resistance for the output resistor, wherein the bias current is greater than the node-biasing current.

The preceding description was exemplary such that those of ordinary skill in the art will appreciate that numerous modifications, substitutions and variations can be made in and to the materials, apparatus, configurations and methods of use of the devices of the present disclosure without departing from the scope thereof. For example, the polarity of transistors may be reversed (PMOS instead of NMOS or NMOS instead of PMOS) to form alternative embodiments. In light of this, the scope of the present disclosure should not be limited to that of the particular embodiments illustrated and described herein, as they are merely by way of some examples thereof, but rather, should be fully commensurate with that of the claims appended hereafter and their functional equivalents.

What is claimed is:
1. A bias current generator, comprising:
an output transistor;
an operational amplifier having an output node connected a gate of the output transistor, wherein during an active mode of operation for the bias current generator the operational amplifier is configured to bias the output node responsive to a comparison of a feedback node voltage to a reference voltage so that the output transistor conducts a bias current during the active mode of operation;
a current source configured to conduct a node-biasing current;
a switching network configured to source the node-biasing current from an output of the operational amplifier during a dormant mode of operation in which output transistor does not conduct the bias current, wherein the bias current is greater than the node-biasing current; and a secondary current generator configured to mirror the bias current into a secondary current, wherein the bias current is greater than the secondary current, and wherein the secondary current is greater than the node-biasing current.

2. The bias current generator of claim 1, wherein the operational amplifier includes a differential pair of transistors, and wherein a gate for a first differential pair transistor in the differential pair of transistors is charged to the feedback node voltage during the active mode of operation and wherein a gate for a second differential pair transistor in the differential pair of transistors is charged to the reference voltage.

3. The bias current generator of claim 2, wherein the switching network includes a first switch transistor configured to switch on during the dormant mode of operation to charge the gate of the first differential pair transistor to a power supply voltage, and wherein the first switch transistor is further configured to switch off during the active mode of operation.

4. The bias current generator of claim 3, wherein the switching network further includes a second switch transistor configured to switch on during the dormant mode of operation to power the first differential transistor with the power supply voltage, wherein the second switch transistor is further configured to switch off during the active mode of operation.

5. The bias current generator of claim 1, wherein the output transistor has a source connected to a power supply node and the secondary current generator comprises:
a first transistor having a source connected to the power supply node and a gate connected to the gate of the output transistor; and
a current mirror connected though a first switch to a drain of the first transistor.

6. The bias current generator of claim 1, wherein the switching network includes a first switch connected between the current source and the output node, wherein the first switch is configured to close during the dormant mode of operation and to open during the active mode of operation.

7. The bias current generator of claim 6, further comprising:
a diode-connected transistor, wherein the switching network further includes a second switch configured to close during the active mode of operation to couple the current source to the diode-connected transistor and configured to open during the dormant mode of operation to isolate the current source from the diode-connected transistor.

8. The bias current generator of claim 7, wherein the current source is configured to conduct the node-biasing current into ground, and wherein the diode-connected transistor has a source connected to a power supply node and a drain connected to the second switch.

9. The bias current generator of claim 2, further comprising a compensation circuit configured to compensate the output node of the operational amplifier.

10. The bias current generator of claim 9, wherein the compensation circuit comprises a compensation capacitor in series with a compensation resistor.

11. A method of operation for an operational amplifier including a first differential pair transistor having a gate connected to a terminal of an output resistor and having a second differential pair transistor having a gate connected to a voltage source providing a reference voltage and having a terminal connected to a gate of an output transistor having a terminal coupled to ground through a first switch and the output resistor, comprising:

during an inactive period for the operational amplifier:

opening the first switch to prevent the output transistor from conducting; and closing a second switch to charge the gate of the first differential pair transistor to a power supply voltage while conducting a node-biasing current through a channel of the first differential pair transistor and through a body diode of the second differential pair transistor in the operational amplifier to bias the gate of the output transistor with the node-biasing current;

during an active period for an operational amplifier:

closing the first switch and opening the second switch so that feedback through the operational amplifier causes the output transistor to conduct a bias current through the output resistor equaling a ratio of the reference voltage and a resistance for the output resistor, wherein the bias current is greater than the node-biasing current; and mirroring the bias current into at least one secondary current.

12. The method of claim 11, wherein mirroring the bias current comprises mirroring the bias current into a first secondary current that is sourced by a first transistor and mirroring the bias current into a second secondary current that is sunk by a second transistor.

13. The method of claim 11, wherein mirroring the bias current forces the at least one secondary current to be less than the bias current and greater than the node-biasing current.

14. The method of claim 11, further comprising closing a third switch during the inactive period to couple a current source conducting the node-biasing current to an output of the operational amplifier and opening the third switch during the active period.

15. The method of claim 14, further comprising closing a fourth switch during the active period to couple the current source to a power supply node and opening the fourth switch during the inactive period.

16. The method of claim 11, further comprising compensating an output node for the operational amplifier during the active period.

17. The method of claim 11, further comprising adjusting a resistance of the output resistor to calibrate the bias current.

\* \* \* \* \*